Oct. 12, 1965 H. V. BECK 3,211,924

LOW FREQUENCY WAVEFORM GENERATORS UTILIZING SAMPLING OF HIGH FREQUENCY WAVEFORM

Filed Oct. 10, 1962 3 Sheets-Sheet 1

INVENTOR
Harold Vincent Beck
BY Baldwin & Wight
ATTORNEY

Oct. 12, 1965 H. V. BECK 3,211,924

LOW FREQUENCY WAVEFORM GENERATORS UTILIZING SAMPLING OF HIGH FREQUENCY WAVEFORM

Filed Oct. 10, 1962 3 Sheets-Sheet 2

INVENTOR

Harold Vincent Beck

BY Baldwin & Wight

ATTORNEY

INVENTOR
Harold Vincent Beck
BY
Baldwin & Wight
ATTORNEY

United States Patent Office 3,211,924
Patented Oct. 12, 1965

3,211,924

LOW FREQUENCY WAVEFORM GENERATORS UTILIZING SAMPLING OF HIGH FREQUENCY WAVEFORM

Harold Vincent Beck, Harpenden, England, assignor to Marconi Instruments Limited, Strand, London, England, a British company Filed Oct. 10, 1962, Ser. No. 229,684
8 Claims. (Cl. 307—88.5)

Figure 11:
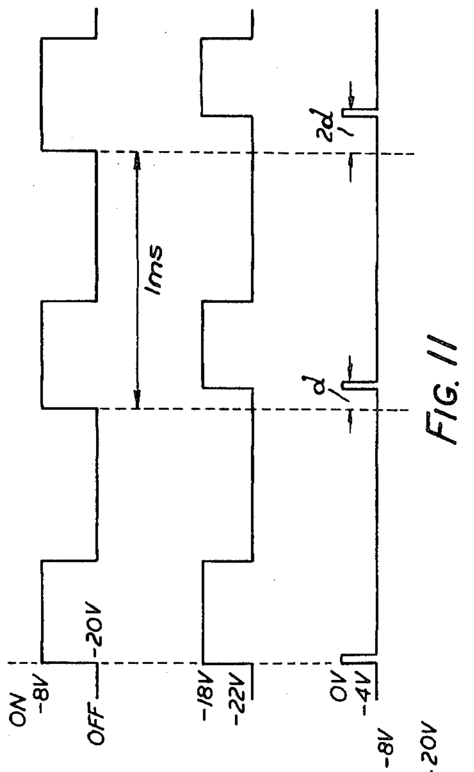

This invention relates to low frequency waveform generators and has for its object to provide improved and relatively simple apparatus capable of producing continuous waveforms of required shapes and frequencies without involving the use of large capacitors; which can be rapidly changed in frequency or amplitude; which shall be such that several waveform outputs in predetermined relative phase and frequency relation which will be maintained if the frequency is changed can be readily obtained; and which shall be of wide application.

Probably the best of the known forms of low frequency waveform generator is the fairly widely used Wien bridge or phase shift oscillator. This device has, however, a number of important defects. It requires for low frequency generation the provision of fairly large capacitors in the circuit, especially if it is of the transistor type. Moreover, inevitable non-linearities in the amplifier which sustains oscillation cause distortion of the output waveform and if negative feedback is applied to control the amplifier gain, the thermal time constant of the feedback system must be greater than the maximum period of oscillation and, accordingly, if it is required to change the frequency or make some other significant change, there is a delay of at least a few cycles before equilibruim is established under the new conditions. Other known forms of waveform generator sometimes used, notably those employing motor-driven transducers and those in which diode circuits are employed to shape a saw-tooth wave, are prone to waveform distortion and are very difficult to make satisfactory especially if, as is customarily the case, the generator is required to be subject to frequency, amplitude or waveform changes.

According to this invention a low frequency waveform generator comprises a relatively high frequency unmodulated wave source, means for sampling different cycles from said source at different times therein to produce a sequence of short pulses of progressively different amplitudes, and a smoothing or integrating circuit to which the short pulses are fed to produce a close approximation to a desired smooth continuous low frequency waveform.

The relatively high frequency wave source may be of any desired wave shape. The most generally required wave shape will, however, be sinusoidal or approximately so and in the particular embodiments of the invention to be described later herein, a sinusoidal shape will be assumed.

Samples will usually be taken from successive cycles of the relatively high frequency wave source. This, however, is not a necessity, for samples may be taken from alternate cycles, or from every third cycle . . . and so on up to a limit set only by practical considerations.

Successive samples may be taken at successively later times in the cycles from the relatively high frequency source or at successively earlier times in said cycles—usually the former.

A preferred form of embodiment of the invention comprises a storage condenser, a gate circuit interposed between the relatively high frequency source and said storage condenser, periodic means for momentarily opening said gate circuit at different times in different cycles of the wave from said high frequency source to charge said condenser to voltages dependent on the times of opening of said gate circuit, means operable between successive times of opening of said gate circuit for discharging said condenser, and a smoothing or integrating circuit fed with the voltage set up across said condenser.

Preferably the charging and discharging of the condenser is effected by a pair of diodes, one in the charging circuit thereof and the other in the discharging circuit thereof, and periodically operating means for rendering said diodes momentarily conductive in turn, first the diode in the discharging circuit and then the one in the charging circuit.

Preferably also the diodes are controlled in conductivity by two multivibrators, the first of which controls the diode in the discharging circuit and also triggers the second multivibrator which controls the diode in the charging circuit.

Sampling of the relatively high frequency wave may be effected under the control of a simpling generator triggered by triggering pulses at a predetermined frequency chosen in dependence upon the desired sampling frequency and supplied from an independent source. Sampling may, however, be effected under the control of pulses which are synchronised by the output of the aforesaid relatively high frequency source and are subjected to a varying delay. In an embodiment of the former nature wherein charging and discharging of a condenser is effected by a pair of diodes, one in the charging circuit and the other in the discharging circuit, and wherein the diodes are controlled in conductivity by two multivibrators, of which the first controls the discharging diode and also triggers the second multivibrator which controls the charging diode, the said first multivibrator is triggered by triggering pulses from the independent source. In an embodiment of the latter nature wherein again charging and discharging of a condenser is effected by a pair of diodes, one in the charging circuit and the other in the discharging circuit, and wherein the diodes are controlled in conductivity by two multivibrators, of which the first controls the discharging diode and also triggers the second multivibrator which controls the charging diode, the output from the relatively high frequency source is employed to synchronise an additional multvibrator. The output pulses from this additional vibrator are then subjected to varying delays, and the resulting delayed pulses are employed to trigger said first multivibrator. In a preferred arrangement the varying delay is obtained by applying synchronised pulses from said additional multivibrator to the base of a transistor connected to discharge, at substantially constant current, a capacitance, the degree of discharge of which is controlled by a further transistor which is, in turn, controlled by a delay controlling voltage wave, e.g. a saw tooth wave. In order to avoid undesired disturbance by flyback of the sawtooth wave, it is preferred to interpose, in the path of the variably delayed triggering pulses to the aforesaid first multivibrator, a gate which is controlled in synchronism with the sawtooth wave in such manner as to interrupt said path during flyback periods.

Figure 1:
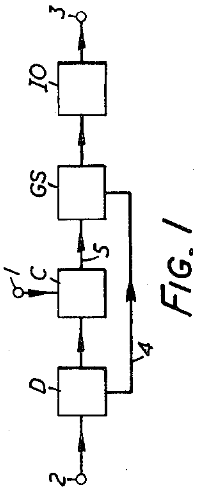
Figure 10:
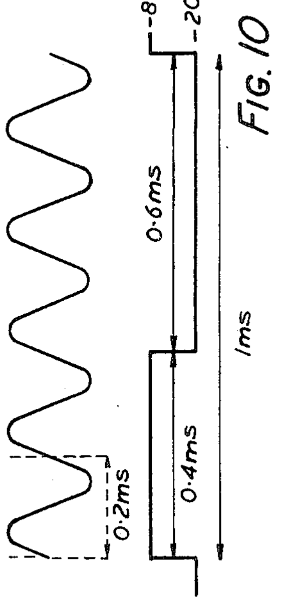
Figure 2:
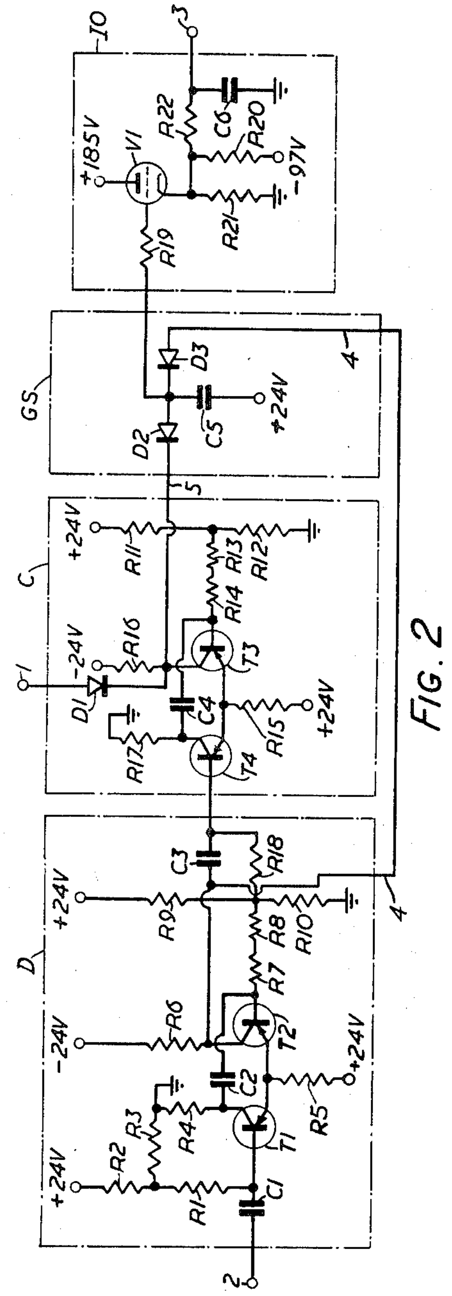
Figure 9:
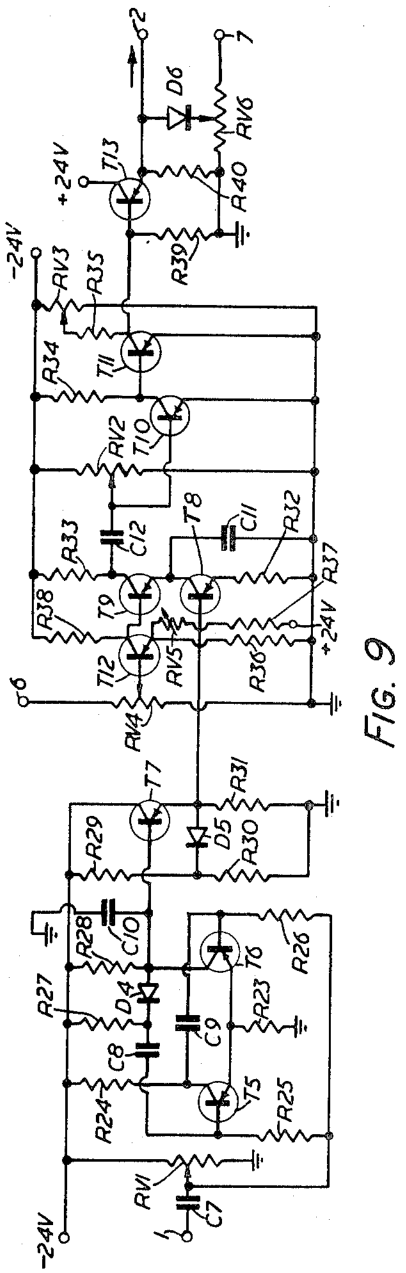

The invention is illustrated in and further explained in the accompanying drawings. For convenience of reference the figures of these drawings are numbered consecutively. In the drawings, FIGURE 1 is a highly simplified block diagram; FIGURES 2 and 9 are more detailed diagrams showing how the invention may be carried into effect; and FIGURES 3, 4, 5, 6, 7, 8, 10 and 11 are explanatory graphical figures showing waveforms.

Referring to FIGURE 1, this is a highly simplified block diagram of an embodiment of the present invention. It comprises a discharging unit D, a charging unit C, a gated storage unit GS and an integrating output unit 10. An input signal of predetermined frequency is applied at the terminal 1 to the charging unit C which functions to develop a sampling pulse which samples the input signal and charges the gated store GS with a stored voltage of value depending on the voltage level of the incoming wave at terminal 1 at the time the sampling pulse is occurring. In normal practice the sampling pulse length does not exceed about 1/100th part of the period of the input signal. The discharging unit D is triggered by a signal from an external source (not shown in FIGURE 1) applied at terminal 2, and the unit D has two functions, namely to discharge the gated store GS after it has been charged by the unit C and to produce a triggered signal after the end of such discharge of the store GS to trigger the unit C to cause it to charge the storage unit again. The sampling repetition rate is thus determined by the repetition rate of the external source connected to terminal 2. The storage device in the gated store is a storage condenser, and the varying voltage across this condenser is applied to the integrating output unit 10 which supplies a practically continuous output waveform at the output terminal 3.

The embodiment shown in block diagram form in FIGURE 1 is represented again in some detail in FIGURE 2 in which the chain line blocks D, C, GS and 10 correspond to the similarly referenced blocks in FIGURE 1. It is convenient first to describe the gated storage unit GS and the integrating output unit 10 since these are the simplest units.

The store GS comprises a storage condenser C5 and two diodes D2, D3, connected as shown. The biases on the diodes are such that both are cut off throughout the storage interval, i.e. the time in which a charge is intended to be stored or retained in condenser C5. A pulse applied over the lead 4 from the discharging unit D renders diode D3 conductive to discharge the condenser. A pulse from the charging unit C renders diode D2 conductive to charge the condenser to the appropriate voltage.

The varying voltage across condenser C5 is applied to the integrating output unit which is designed to ensure that there shall be only a very low leakage current circuit across the store GS. This unit comprises a cathode follower valve V1 followed by the resistance-capacity integrating network shown to smooth out the discontinuities which are due to the charging and discharging of condenser C5 and which causes the voltage at that condenser momentarily to rise to the positive supply voltage (+24 v. in the example illustrated) each time the condenser is fully discharged. The integrating time constant is made long compared with the times taken to charge or discharge, but short compared with the time during which a charge in the condenser is stored thereby. Accordingly an output waveform which is a reasonably close approximation to a continuous waveform is obtained.

Figure 3:
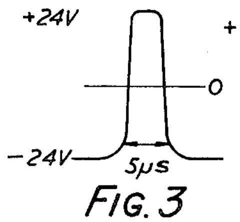

Turning now to the units D and C, the former includes a flip-flop circuit as known per se comprising two transistors T1, T2 of which T1 is normally conducting and T2 normally cut off. A suitable positive pulse of, for example, +5 v. and 1 $\mu$ sec. duration triggers the circuit and T2 becomes conductive and then again non-conductive. Accordingly, the collector of T2 changes from −24 v. to +24 v. This constitutes the discharging pulse. FIGURE 3 illustrates this pulse which is applied over lead 4 (FIGURE 1) to the diode D3.

Figure 4:
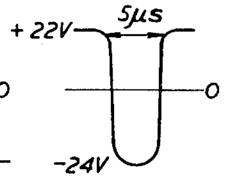
Figure 5:
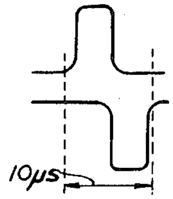

This pulse is also differentiated by a differentiating circuit comprising condenser C3 and the input impedance of the transistor T4 in the charging unit C and the differentiated resultant, in the form of a positive voltage "kick" followed by a negative one appears on the base of T4. This transistor and transistor T3 together form a flip-flop circuit which is normally in the "off" state, i.e. T4 is blocked. The positive "kick" on the base of T4 has no effect, but the negative one renders T4 conductive, triggering the circuit so that T3 is cut off and then becomes conductive again and accordingly produces at its collector a negative going pulse as illustrated in FIGURE 4. This pulse, which is the charging pulse, is applied over lead 5 (FIGURE 1) to the diode D2. The discharging and charging pulses are sequential. The overall discharge-charge time may be of the order of 10 $\mu$ sec. as shown in FIGURE 5 in which both sequential pulses are conventionally represented.

The collector of T3 is further clamped by a diode D1 connected to an input signal source via terminal 1. If the clamping diode D1 and the signal source were not present, i.e. if diode D1 were disconnected, then the collector of T3 would drop to −24 v. during a sampling. But with this diode D1 present as shown, and connected at terminal 1 to a signal source of low impedance or to a signal source through an emitter follower stage (to produce the effect of a low impedance source) the voltage at the collector of T3 cannot fall below the value the signal voltage has when the charging pulse occurs. This will be clear from FIGURE 6 in which sampling of a sinusoidal signal wave of 20 volts peak-to-peak is illustrated, the full line V*c*3 representing the voltage at the collector of T3 and the broken line 1*a* representing a sinusoidal waveform applied at terminal 1. Clearly the amplitude of input signal that can be handled is limited by the operating voltages of the circuit. This will be apparent from FIGURE 7 which is a diagram similar to that of FIGURE 6 showing what happens if an attempt is made to sample a signal waveform of 52 volts peak-to-peak (referenced 1*b* in FIGURE 7) by a voltage waveform V*c*3 as shown in, and of the same operating voltages as, the waveform V*c*3 of FIGURE 6.

Figure 6:
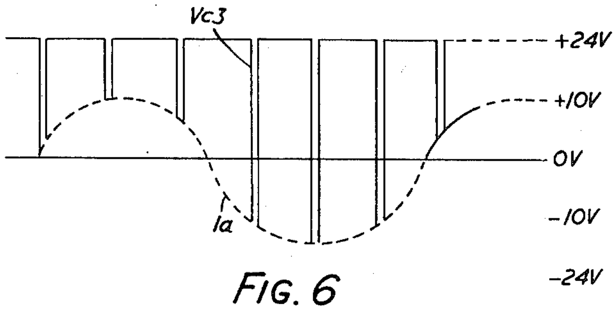
Figure 7:
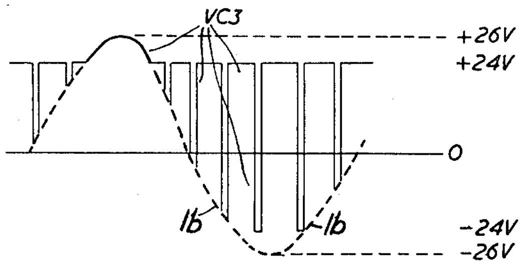

For the sake of simplicity of drawing and explanation FIGURES 6 and 7 are drawn as though the sampling pulse repetition frequency were about seven times that of the signal frequency at terminal 1. In preferred practice the sampling pulse repetition rate is made slightly different from the input frequency at terminal 1 so that one sample is taken from each cycle at a slightly different time therein: thus if the sampling frequency is slightly less than the signal frequency the samples taken from successive cycles will be succesively slightly later therein. However, the invention is not limited to taking a sample from each successive cycle, for obviously a like result can be obtained by taking a sample from each alternate cycle, or each third cycle . . . or each $n^{th}$ cycle at a slightly different point in successive sampled cycles.

The operation of the gated store GS is very simple. Assume the case of sampling a 20 volt peak-to-peak signal. The diodes D2, D3 are normally back-biased. When the discharging pulse occurs, the anode of D3 goes to nearly +24 v. (taking the voltage values illustrated) so that D3 becomes forward-biased and condenser C5 discharges until its output terminal reaches substantially +24 v. The discharging pulse ends and the charging pulse occurs. Now the output terminal of C5 is at +24 v., the anode of D3 is at −24 v. and the cathode of D2 goes to some value between −10 v. and +10 v. depending on the voltage appearing at 1 during the charging pulse. D2 is accordingly forward biased and the condenser C5 will charge until its output terminal voltage reaches that of the cathode of D2. After the end of the charging pulse the voltage in the condenser C5 will remain constant (neglecting leakage, which is kept as low as possible) until the next discharge-charge cycle commences.

The output frequency $f_o$ will be equal to the difference between the signal frequency $f_1$ and the fundamental or nearest harmonic of the sampling pulse repetition frequency $f_s$, i.e.

$$f_o = f_1 - nf_s$$

where $n$ is any whole number including unity. Obviously, if $nf_s = f_1$ the output frequency $f_o = 0$.

Figure 8:
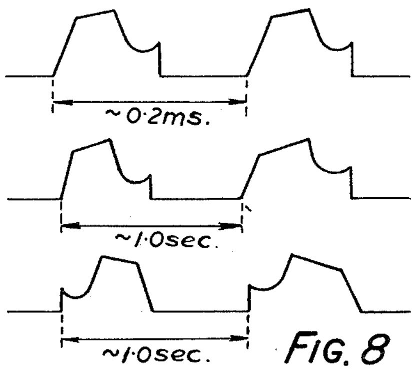

It may be noted that $f_s$ may be above $f_1$. FIGURE 8 shows, for purpose of comparison what happens in the case of an asymmetrical input waveform sampled at a frequency a little below, or the same amount above, the input frequency. The top line in FIGURE 8 represents an input waveform of $f_1$=5000 c./s. The middle line represents the output at 1 c./s. if $f_s$=4999 c./s. and the bottom line represents the output, also at 1 c./s. if $f_s$=5001 c./s. It will be seen that the second and third lines show waveforms which are in mirror image relationship.

In FIGURE 2 as above described the sampling trigger pulses are derived from a suitable external source (not shown in FIGURE 2) connected at terminal 2. However, this is not a necessary limitation for the sampling trigger pulses can be derived from the signal itself (at terminal 1 in FIGURE 2) instead of from an independent generator. An arrangement by means of which this is done will now be described with reference to FIGURE 9, in which the required variation of delay is obtained by using a saw-tooth wave time base generator such as is employed for a cathode ray oscilloscope and having a required slow sweep rate.

Referring to FIGURE 9, input signals at terminal 1, which is the same terminal as terminal 1 of FIGURE 2, are used to synchronise a multi-vibrator comprising transistors T5 and T6. Assuming the signal at 1 is a 5 kc./s. signal as represented the upper line of FIGURE 10, this multi-vibrator is connected and dimensioned in manner known per se to operate at (for example) 1 kc./s. which will give a storage period of about 1 ms. As will be apparent later, the maximum delay which can be achieved in delay variation is set by the length of the "mark" portion of the output of this multi-vibrator. In this particular case now being described the length of "mark" is 0.4 ms. and the length of "space" is 0.6 ms. as shown in the lower line of FIGURE 10 which represents the waveform at the collector of T6. This waveform is fed to an emitter follower including transistor T7 in whose output circuit is a diode D5 by which clamping is accomplished. If desired, means may be provided for slightly altering the mark/space ratio of the multi-vibrator T5, T6 to accommodate variation in the input frequency $f_1$ at 1.

The output from T7 is applied to an arrangement which will produce an output trigger pulse delayed after the beginning of each "mark" pulse from the emitter follower T7 by an amount determined by a delay varier (modulator). The beginning of each such "mark" pule may be referred to as the "fiduciary instant" since it is from this instant that the delay is measured.

The output from T7 is applied to the base of transistor T8. The top line of FIGURE 11 shows the waveform at the base of T8. In FIGURE 11 fiduciary instants are represented by broken vertical lines.

The variable delay is produced by two transistors T8, T9 in conjunction with a condenser C11, which as will be seen later, is discharged at substantially constant current. Initially the base of T8 is at a relatively high negative potential (−20 v.) and its collector is at the same potential while the base of T9 is a smaller negative potential so that this transistor is blocked. Condenser C11 is accordingly charged to a voltage equal to the blocking voltage on the base of T8. When this base voltage changes to its other value at which T8 conducts C11 discharges with substantially constant current and the collector T8 rises substantially linearly in voltage until it reaches the voltage at the base of T9 whereupon T9 starts conducting and the collector of T8 is held at the base voltage of T9. A step of voltage now appears at the collector of T9 as shown by the middle line of FIGURE 11. A delay, determined by the difference between the "off" or blocking voltage at the base of T8 and what may be termed the "reference" voltage at the base of T9, is thus introduced between the leading edges of the voltage steps at the base of T8—the fiduciary instants—and the leading edges of the voltage at the collector of T9. Because the voltage on the collector of T8 cannot go higher than the "on" value of the its base voltage, the reference voltage value on the base of T9 must always be of some value between the "on" and "off" voltages on the base of T8. The collector of T9 feeds into circuits which include transistors T10 and T11 and are suitably designed in known manner to differentiate the leading edge of the pulse from the said collector and shape the differentiated pulse to a form suitable for triggering the discharging unit D (of FIGURE 2). The bottom line of FIGURE 11 shows the resultant pulses on the collector of T11. It is possible to apply these pulses direct to the terminal 2 of FIGURE 2 but preferably a gate circuit is interposed as and for a purpose to be described later.

The "reference" voltage on the base of T9 is a slow "ramp" voltage, i.e. the flank of a sawtooth voltage wave of required frequency derived, for example, from an oscilloscope time base via an inverter circuit including transistor T12. The time base (not shown) is connected at terminal 6. The potentiometer RV4 and variable resistance RV5 enable adjustment to be made of the voltage ramp slope and D.C. level applied to the base of T9 and in practice are adjusted to give one cycle of the output period on the screen of the oscilloscope providing the ramp so that the output period is the same as the time base range setting. In this way gradually increasing time delays *d*, 2*d* . . . and so on occurring over each ramp are obtained as shown by the bottom line in FIGURE 11.

Flyback in the time base will give discontinuities in the output at 3 when samples are taken during flyback. This may be prevented by inserting a gate circuit including transistor T13 and diode D6 between the collector of T11 and terminal 2 (FIGURE 2). The gate circuit is operated by pulses occurring during flyback and obtained from the oscilloscope time base in known manner (in most oscilloscope circuits such pulses are normally available anyway) and applied at terminal 7 so that, during the occurrence of flyback, the path between the collector of T11 and terminal 2 is interrupted and no sampling can occur.

The following values of circuit elements, which, like the voltages and frequencies mentioned herein, are given by way of example only, have been found satisfactory in experimental practice:

| | | |
|---|---|---|
| R1, R7, R14 | | 2.2K |
| R2, R11 | | 5.6K |
| R3, R12 | | 16.5K |
| R4, R17, R22 | | 10K |
| R5, R13 | | 1.8K |
| R6, R16 | | 22K |
| R8 | | 4.7K |
| R9, R23 | | 3.9K |
| R10 | | 18K |
| R15, R19 | | 1K |
| R18 | | 27K |
| R20 | | 220K |
| R21, R26 | | 100K |
| R24, R28, R30 | | 15K |
| R25 | | 230K |
| R27 | | 390K |
| R29 | | 9.1K |
| R31, R35, R38, R40 | | 6.8K |
| R32 | | 68K |
| R33, R34 | | 56K |
| R36 | | 16K |
| R37 | | 11K |
| R39 | | 330K |
| RV1, RV2, RV3, RV6 | | 100K |
| RV4, RV5 | | 10K |
| C1, C7, C12 | μf | 0.001 |
| C2 | μμf | 220 |
| C3 | μμf | 15 |
| C4 | μμf | 300 |
| C5 | μμf | 150 |

| | | |
|---|---|---|
| C6 | μf | 0.1 |
| C8, C9, C11 | μf | 0.01 |
| C10 | pf | 68 |
| Transistors T1 to T6 inclusive and T8 to T12 inclusive | | Type 0C700A |
| T7 and T13 | | Type 0C205 |
| Diodes D1, D4, D5 and D6 | | Type IN63 |
| D2 and D3 | | Type IN540 |

Although in the above described and illustrated embodiment the relatively high frequency input (at terminal 1, FIGURES 2 and 9) has been assumed to be sinusoidal, it will now be evident that any desired wave shape may be employed.

Obviously the invention lends itself to embodiments providing a number of low frequency outputs which may be in any desired phase relationships inter se. Thus, for example, two outputs could be obtained by duplicating the units C, GS and 10 of FIGURE 1 and employing a common unit D for the duplicated units.

I claim:

1. A low frequency waveform generator comprising, in combination: a relatively high frequency unmodulated wave source; means for sampling different cycles of the unmodulated wave from said source at different times therein, said sampling means comprising a storage condenser, a charging circuit including a first diode interposed between said high frequency source and said storage condenser, a discharging circuit including a second diode connected to said storage condenser, and periodically operating means for rendering said first diode and then said second diode momentarily conductive in turn, thereby charging said storage condenser to voltages dependent upon the times of first diode conduction and subsequently discharging said storage condenser; and smoothing or integrating circuit means fed with the voltages appearing across said storage condenser.

2. A generator as claimed in claim 1 wherein said periodically operating means comprises two multivibrators, the first of which controls the diode in the discharging circuit and also triggers the second multivibrator which controls the diode in the charging circuit.

3. A generator as claimed in claim 2 wherein sampling of the relatively high frequency source is effected under the control of a sampling generator triggered by triggering pulses at a predetermined frequency chosen in dependence upon the desired sampling frequency and supplied from an independent source.

4. A generator as claimed in claim 2 wherein said first multivibrator is triggered by pulses at a predetermined frequency chosen in dependence upon the desired sampling frequency and derived from an independent source.

5. A generator as claimed in claim 1 wherein sampling of the relatively high frequency source is effected under the control of pulses which are synchronised by said high frequency source and are subjected to a varying delay.

6. A generator as claimed in claim 2, and further comprising an additional multivibrator synchronized by the unmodulated wave from said high frequency source and producing output pulses; means for variably delaying the output pulses from said additional multivibrator; and means for applying the delayed output pulses to said first multivibrator to trigger it.

7. A generator as claimed in claim 6, wherein said variably delaying means comprises a transistor having a base which receives the output pulses from said additional multivibrator, a capacitor connected to be discharged at substantially constant current by said transistor, and means for controlling the degree of discharge of said capacitor comprising a further transistor in turn controlled by a delay controlling voltage wave.

8. A generator as claimed in claim 2, and further comprising an additional multivibrator synchronized by the unmodulated wave from said high frequency source and producing output pulses; means for variably delaying the output pulses from said additional multivibrator including a transistor having a base connected to said additional multivibrator, a capacitor connected to be discharged at substantially constant current by said transistor, and means for controlling the degree of discharge of said capacitor, the latter means comprising a further transistor in turn controlled by a delay controlling sawtooth voltage wave; and means for applying the delayed output pulses to said first multivibrator to trigger it, said applying means including a gate circuit controlled in synchronism with said sawtooth voltage wave to interrupt the path of application of delayed output pulses during the flyback periods of said sawtooth voltage wave.

References Cited by the Examiner

UNITED STATES PATENTS

| | | | |
|---|---|---|---|
| 2,621,289 | 12/52 | Gray | 328—15 X |
| 2,840,707 | 6/58 | Johnson | 328—151 |
| 3,011,129 | 11/61 | Magleby et al. | 328—151 |
| 3,085,206 | 4/63 | Jahn | 328—150 X |

ARTHUR GAUSS, *Primary Examiner.*